(12) United States Patent
Sakuma et al.

(10) Patent No.: US 11,121,096 B2
(45) Date of Patent: Sep. 14, 2021

(54) ACTIVE CONTROL OF ELECTRONIC PACKAGE WARPAGE

(71) Applicant: International Business Machines Corporation, Armonk, NY (US)

(72) Inventors: Katsuyuki Sakuma, Fishkill, NY (US); Shidong Li, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 12 days.

(21) Appl. No.: 16/360,402

(22) Filed: Mar. 21, 2019

(65) Prior Publication Data

US 2020/0303322 A1   Sep. 24, 2020

(51) Int. Cl.
| | |
|---|---|
| *H05K 1/02* | (2006.01) |
| *H01L 23/10* | (2006.01) |
| *H01L 23/00* | (2006.01) |
| *H01L 23/58* | (2006.01) |
| *G01B 7/16* | (2006.01) |

(52) U.S. Cl.
CPC .............. *H01L 23/562* (2013.01); *G01B 7/16* (2013.01); *H01L 23/58* (2013.01); *H05K 1/0271* (2013.01); *H01L 23/10* (2013.01); *H01L 24/16* (2013.01); *H01L 2224/16225* (2013.01); *H01L 2924/3511* (2013.01); *H05K 2201/09136* (2013.01); *H05K 2201/10083* (2013.01); *H05K 2201/10151* (2013.01); *H05K 2201/10674* (2013.01); *H05K 2201/10734* (2013.01)

(58) Field of Classification Search
CPC ........... H01L 23/562; H01L 2924/3511; H01L 23/10; H05K 2201/10734; H05K 2201/10674; H05K 2201/10151; H05K 2201/09136
USPC ............................ 257/48; 438/11, 14, 15, 18
See application file for complete search history.

(56) References Cited

U.S. PATENT DOCUMENTS

| | | | |
|---|---|---|---|
| 6,377,227 B1 | 4/2002 | Zhu et al. | |
| 7,934,430 B2 | 5/2011 | Irving et al. | |
| 7,942,072 B2 | 5/2011 | Chang et al. | |
| 8,113,065 B2 | 2/2012 | Ohsato et al. | |
| 9,709,377 B2 | 7/2017 | Ohta et al. | |
| 9,949,384 B2 | 4/2018 | Yamanaka | |
| 9,953,934 B2 | 4/2018 | Kumar et al. | |

(Continued)

OTHER PUBLICATIONS

Tucker, "Actuation for Mobile Micro-Robotics," https://archives.ece.ncsu.edu/erl/microrobotics/actuation/actuation.html, Retrieved: Jan. 16, 2019, 7 pages.

(Continued)

*Primary Examiner* — Didarul A Mazumder

(74) *Attorney, Agent, or Firm* — Amin, Turocy & Watson, LLP

(57) ABSTRACT

Systems and/or techniques associated with active control of electronic package warpage are provided. In one example, a system includes an electronic package and an integrated circuit. The electronic package includes a patterned structural material associated with a mechanical characteristic that changes in response to an applied condition. The integrated circuit controls the applied condition associated with the patterned structural material based on sensor data associated with a status of the electronic package.

15 Claims, 11 Drawing Sheets

(56) References Cited

U.S. PATENT DOCUMENTS

| | | | |
|---|---|---|---|
| 2007/0222472 A1* | 9/2007 | Raravikar | B82Y 10/00 |
| | | | 73/774 |
| 2017/0131160 A1* | 5/2017 | Lu | G01L 1/16 |
| 2017/0178987 A1 | 6/2017 | Kumar et al. | |
| 2017/0230032 A1* | 8/2017 | Kang | H03H 9/1071 |
| 2017/0287757 A1* | 10/2017 | Kwasnick | H01L 21/67288 |
| 2018/0041839 A1* | 2/2018 | Abe | H04R 1/025 |

OTHER PUBLICATIONS

Mathworks.com, "Deflection of Piezoelectric Actuator," Deflection of Piezoelectric Actuator—MATLAB & Simulink, Retrieved: Jan. 16, 2019, 10 pages.

En.wikipedia.org, "Lead zirconate titanate," Retrieved: Jan. 16, 2019, 3 pages.

Gurrum, "Mechanical Modeling Advances Improve Semiconductor Packaging," http://electronicdesign.com/components/mechanical-modeling-advances-improve-semiconductor-packaging, Jun. 3, 2014, 24 pages.

Furukawa-FTM.com, "Shape Memory Alloys & Super-elastic Alloys," Copyright(C) Furukawa Techno Material Co., Ltd. 2000, 2 pages.

IOPscience.IOP.org, "One-step firing for electroded PZT thick films applied to MEMS," Retrieved: Jan. 16, 2019, 1 page.

Owlnet.rice.edu, "Spring2004," MSCI 301—Materials Science—Spring 2004, Retrieved: Jan. 16, 2019, 3 pages.

* cited by examiner

ACTIVE CONTROL OF ELECTRONIC PACKAGE WARPAGE

BACKGROUND

The subject disclosure relates to electronic package systems, and more specifically, to controlling warpage related to an electronic package.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatuses and/or devices that facilitate active control of electronic package warpage are described.

According to an embodiment, a system can comprise an electronic package and an integrated circuit. The electronic package can comprise a patterned structural material associated with a mechanical characteristic that changes in response to an applied condition. The integrated circuit can control the applied condition associated with the patterned structural material based on sensor data associated with a status of the electronic package.

According to another embodiment, a computer-implemented method is provided. The computer-implemented method can comprise monitoring, by a system operatively coupled to a processor, sensor data generated by one or more sensors associated with an electronic package. The computer-implemented method can also comprise generating, by the system, a control signal to alter a condition of a patterned structural material associated with the electronic package in response to a determination that the sensor data satisfies a defined criterion.

According to yet another embodiment, a computer program product for facilitating control of electronic package warpage can be provided. The computer program product can comprise a computer readable storage medium having program instructions embodied therewith. Furthermore, the program instructions can be executable by a processor to cause the processor to monitor, by the processor, sensor data generated by one or more sensors associated with the electronic package. The program instructions can also cause the processor to control, by the processor, an applied condition of a patterned structural material associated with the electronic package based on the sensor data.

DETAILED DESCRIPTION

Figure 1:
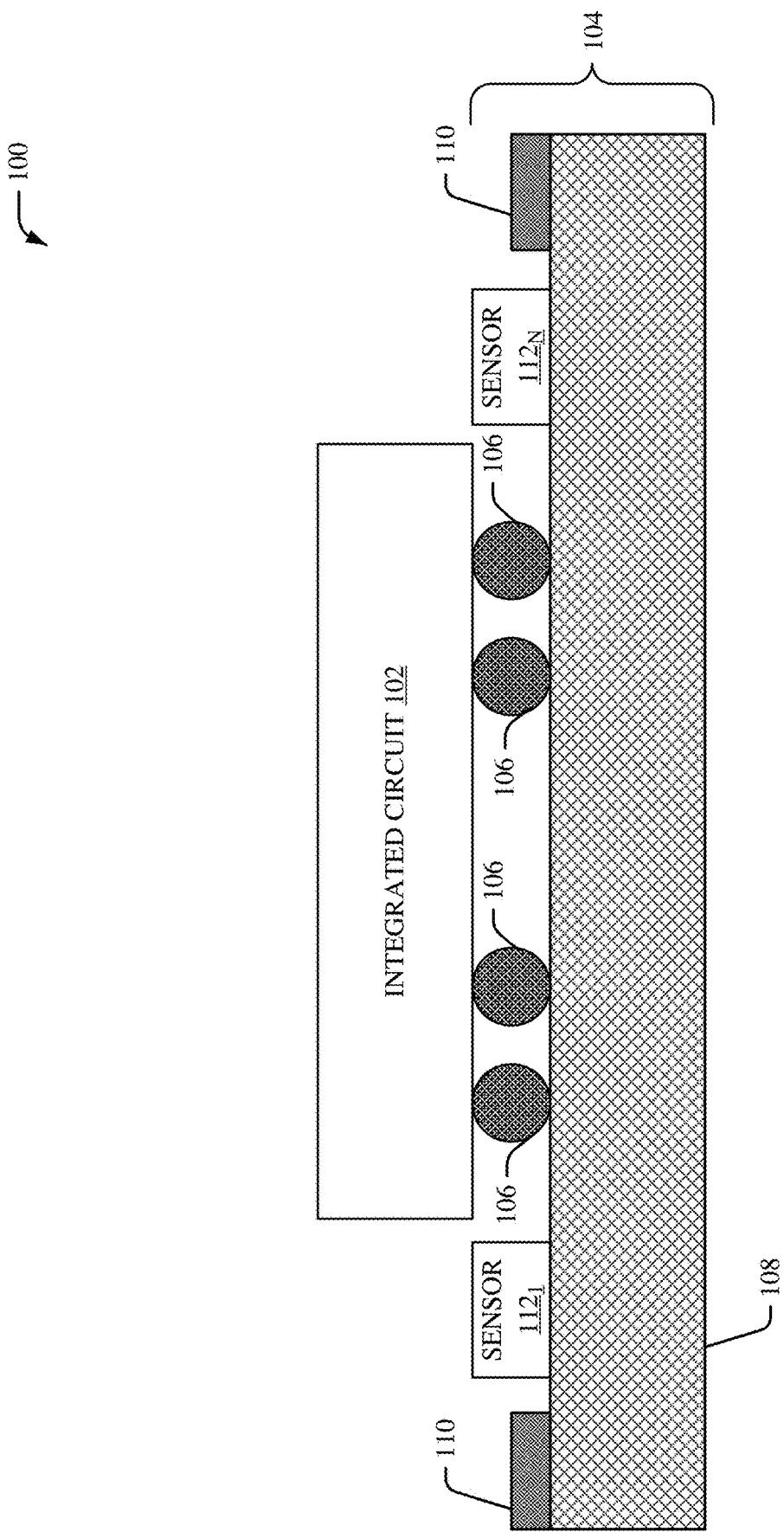
FIG. 1 illustrates an example, non-limiting system associated with an integrated circuit and an electronic package in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Technology related to high bandwidth and/or low latency electronics imposes increased challenges on chip carrier laminates for electronics, as well as printed circuit boards for electronics. For example, certain technologies such as artificial intelligence, high-performance computing, etc. require high bandwidth and/or reduced interconnections for electronics. High bandwidth and/or low latency electronics are generally achieved via increased electronic chip size and/or compactly packaged components. However, a larger electronic chip increases thermomechanical stress. Furthermore, compactly packaged components restrain compliance of a laminate, thereby increasing stress for an electronic. Adoption of a low dielectric loss material also generally results in decreased strength of a laminate. In addition, it is generally desirable to adequately design an electronic package to withstand various environmental stresses. However, design objectives generally conflict. For example, a stress/temperature mechanism in a dry condition for an electronic package can be different than a wet condition. As such, achieving a reliability requirement for an electronic package is becoming increasingly difficult.

Embodiments described herein include systems, methods, apparatuses and devices that facilitate active control of electronic package warpage. For example, a novel electronic package solution based on active control of warpage for the electronic package can be provided. In an aspect, an electronic package can include a patterned structural component made of a material that can adjust a mechanical coupling behavior among the electronic package. The material for the patterned structural component can be a piezoelectric material, a memory alloy, an electric actuator, or another type of material with a mechanical characteristic that can be adjusted. In one example, the patterned structural component made of a material that can adjust a mechanical coupling behavior among an electronic chip, a chip carrier laminate and/or a heat dispenser. In an embodiment, a mechanical characteristic of a material for a patterned structural component can be controlled by an integrated circuit on a laminate. In another embodiment, a mechanical characteristic of a material for a patterned structural component can be controlled by a separate control circuit on a laminate and/or a printed circuit board. Furthermore, in another aspect, one or more sensors can be included in the electronic package to monitor a status of the electronic package. The one or more sensors can include one or more strain sensors (e.g., one or more strain gauges). In certain embodiments, the one or more sensors can additionally or alternatively include one or more thermal sensors, one or more humidity sensors, and/or one or more other sensors. The integrated circuit or the control circuit can control a mechanical characteristic of a material for a patterned structural component based on sensor data generated by the one or more sensors. In an example, sensor data associated with force, stress and/or strain of a laminate can be measured by one or more sensors. The sensor data can be monitored by the integrated circuit or the control circuit. In response to a determination that the sensor data is higher than a threshold, a feedback signal can be transmitted to the patterned structured component to activate (or deactivate) warpage of the laminate (e.g., to alter a shape of the laminate). As such, warpage of an electronic package can be mitigated. For example, warpage of an electronic package can be mitigated by dynamically changing supporting force associated with the electronic package. Low cycle fatigue of an electronic package can also be mitigated. One or more chip fractures associated with an electronic package can also be avoided. Moreover, damage to a dielectric, solder and/or wiring associated with an electronic package can be avoided. Furthermore, performance of an integrated circuit (e.g., an electronic chip) associated with an electronic package can be improved.

FIG. 1 illustrates an example, non-limiting system 100 in accordance with one or more embodiments described herein. The system 100 can be an electronic package system. Furthermore, the system 100 can be highly technical in nature, that is not abstract and that cannot be created by a set of mental acts by a human. Further, the system 100 can be employed to solve new problems that arise through advancements in technology such as, for example, electronic chip technologies, integrated circuit technologies, electronic package technologies, flip chip technologies, artificial intelligence technologies, high-performance computing technologies, circuit technologies, and/or computer architecture, and the like. One or more embodiments of the system 100 can provide technical improvements to an electronic package by reducing warpage of the electronic package. One or more embodiments of the system 100 can additionally or alternatively provide technical improvements to an integrated circuit (e.g., an electronic chip) associated with an electronic package by at least improving quality of an integrated circuit (e.g., an electronic chip) associated with an electronic package, improving performance of an integrated circuit (e.g., an electronic chip) associated with an electronic package, improving voltage characteristics of an integrated circuit (e.g., an electronic chip) associated with an electronic package, and/or one or more other technical improvements associated with an integrated circuit (e.g., an electronic chip) associated with an electronic package.

In the embodiment shown in FIG. 1, the system 100 can include an integrated circuit 102 and an electronic package 104. The integrated circuit 102 can be an integrated circuit chip that includes one or more computer chips. In an embodiment, the integrated circuit 102 can include one or more processors, a central processing unit, one or more graphics processing units, one or more memory units (e.g., one or more high bandwidth memory), and/or one or more electrical components. In one example, the integrated circuit 102 can be a specialized integrated circuit for deep learning, artificial intelligence, and/or high-performance computing. In certain embodiments, the integrated circuit 102 can be a silicon integrated circuit. The integrated circuit 102 can be bonded to the electronic package 104 via solder 106. The solder 106 can be, for example, a set of solder bumps. In an embodiment, the solder 106 can provide a controlled collapse chip connection between the integrated circuit 102 and the electronic package 104. In one example, the integrated circuit 102 can be bonded to the electronic package 104 to provide a flip chip. The electronic package 104 can include a chip carrier 108, patterned structural material 110, and/or one or more sensors $112_{1-N}$, where N is an integer. For instance, the integrated circuit 102 can be bonded to the chip carrier 108 of the electronic package 104 via the solder 106. Furthermore, the patterned structural material 110 can be deposited on one or more surfaces of the chip carrier 108. The one or more sensors $112_{1-N}$ can include one or more sensors. The one or more sensors $112_{1-N}$ can also be fabricated on one or more surfaces of the chip carrier 108. The chip carrier 108 can be a chip carrier material such as, for example, a laminate. In an example, the chip carrier 108 can be a laminate fabricated via an organic laminating process. The patterned structural material 110 can be associated with a mechanical characteristic that changes in response to an applied condition. For example, the patterned structural material 110 can be associated with a mechanical characteristic that changes in response to an applied electrical condition. In another example, the patterned structural material 110 can be associated with a mechanical characteristic that changes in response to an applied pneumatic condition. In yet another example, the patterned structural material 110 can be associated with a mechanical characteristic that changes in response to an applied hydraulic condition. In an embodiment, the patterned structural material 110 can be a piezoelectric material where a structure of the piezoelectric material (e.g., a shape of the piezoelectric material) is modified in response to an applied voltage. The patterned structural material 110 can include, for example, a piezoelectric crystal, a piezoceramic material, a piezoelectric quartz and/or another type of piezoelectric material. For example, the patterned structural material 110 can include, but is not limited to, quartz crystal, lead zirconate titanate (PZT), barium titanate, lithium niobite, etc. In another embodiment, the patterned structural material 110 can be a memory alloy where a structure of the memory alloy is modified in response to an applied electric current. For example, a physical transformation of the memory alloy (e.g., expansion or contraction of the memory alloy) can be achieved by heating the memory alloy via an applied electric current. In yet another embodiment, the patterned structural material 110 can be an electric actuator where a structure of the electric actuator is modified in response to an applied electric current, an applied fluid pressure, or an applied pneumatic pressure. The patterned structural material 110 can be located at one or more locations on the chip carrier 108 to facilitate warpage control of the chip carrier 108.

The one or more sensors $112_{1-N}$ can be one or more strain sensors (e.g., one or more strain gauge sensors) and/or one or more stress sensors. Additionally or alternatively, in certain embodiments, the one or more sensors $112_{1-N}$ can be one or more thermal sensors, one or more humidity sensors, and/or one or more other sensors. In an embodiment, the one or more sensors $112_{1-N}$ can generate sensor data associated with a status of the electronic package 104 and/or the integrated circuit 102. For example, the one or more sensors $112_{1-N}$ can generate sensor data associated with a status of the chip carrier 108. The status of the electronic package 104 and/or the integrated circuit 102 can include a strain status, a stress status, a temperature status, a humidity status and/or another status of the electronic package 104 and/or the integrated circuit 102. For example, the status of the chip carrier 108 can include a strain status, a stress status, a temperature status, a humidity status and/or another status of the chip carrier 108. In an aspect, the one or more sensors $112_{1-N}$ can repeatedly measure a strain status, a stress status, a temperature status, a humidity status and/or another status of the electronic package 104 and/or the integrated circuit 102 during an interval of time. The one or more sensors $112_{1-N}$ can be communicatively coupled to the integrated circuit 102. For instance, the sensor data generated by the one or more sensors $112_{1-N}$ can be transmitted to the integrated circuit 102 via one or more wired communication connections between the integrated circuit 102 and the one or more sensors $112_{1-N}$. Additionally or alternatively, the sensor data generated by the one or more sensors $112_{1-N}$ can be transmitted to the integrated circuit 102 via one or more wireless communication connections between the integrated circuit 102 and the one or more sensors $112_{1-N}$. Based on the sensor data provided by the one or more sensors $112_{1-N}$, the integrated circuit 102 can determine whether a control signal is to be generated to control an applied condition of the patterned structural material 110. For instance, the integrated circuit 102 can monitor the sensor data generated by the one or more sensors $112_{1-N}$. Furthermore, in response to a determination that the sensor data satisfies a defined criterion (e.g., the sensor data is above a defined threshold level), the integrated circuit 102 can generate a control signal to alter an applied condition of the patterned structural material 110, thereby controlling warpage of the chip carrier 108. Moreover, improved reliability of the electronic package 104 and/or the integrated circuit 102 can be provided.

Figure 2:
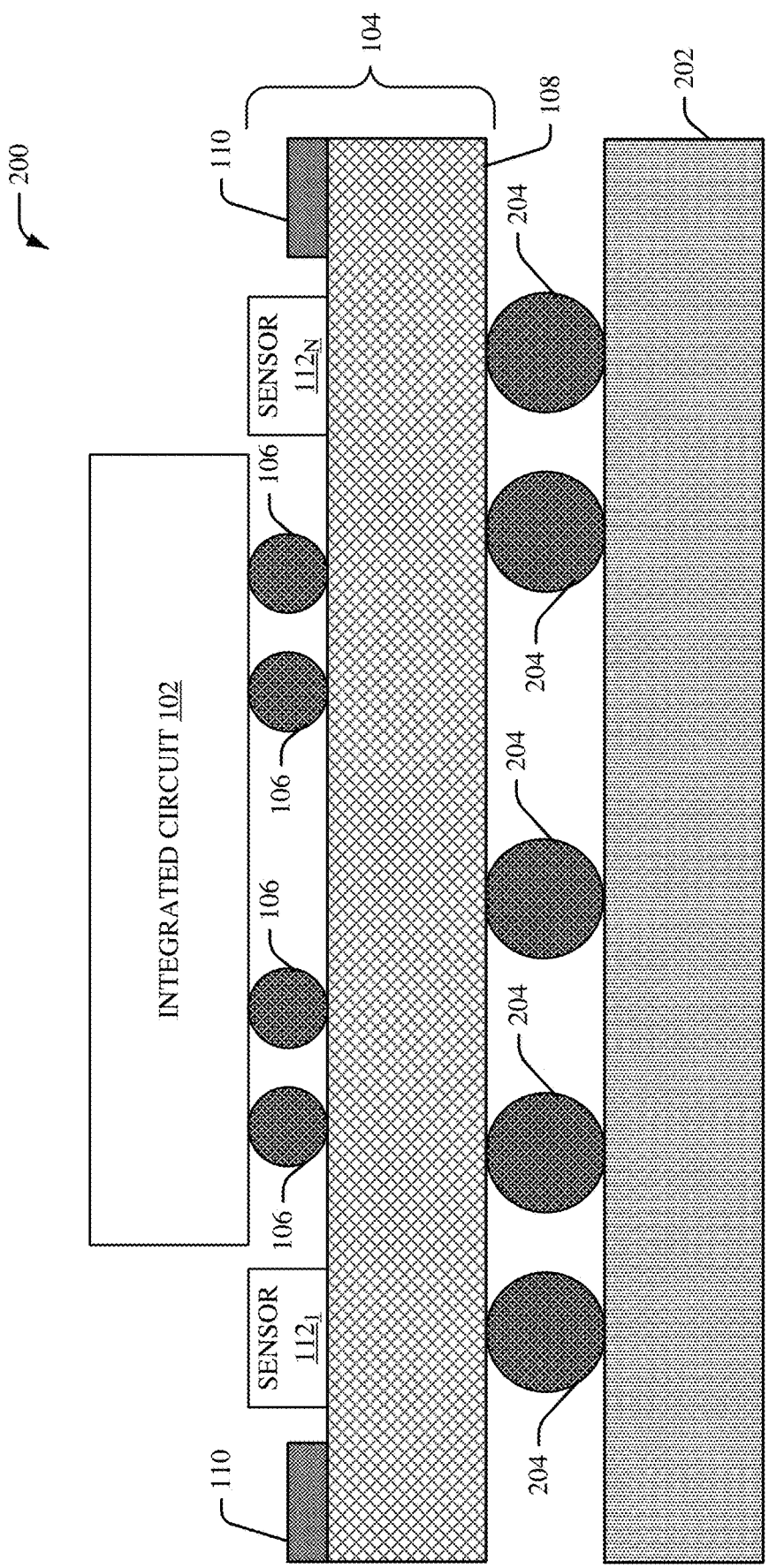
FIG. 2 illustrates an example, non-limiting system associated with an integrated circuit, an electronic package and a printed circuit board in accordance with one or more embodiments described herein.

FIG. 2 illustrates an example, non-limiting system 200 in accordance with one or more embodiments described herein. Repetitive description of like elements employed in other embodiments described herein is omitted for sake of brevity.

The system 200 includes the integrated circuit 102, the electronic package 104 and a printed circuit board 202. The electronic package 104 can include the chip carrier 108, the patterned structural material 110, and/or the one or more sensors $112_{1-N}$. The integrated circuit 102 can be bonded to the electronic package 104 via the solder 106. Furthermore, the electronic package 104 can be bonded to the printed circuit board 202 via solder 204. For example, the chip carrier 108 of the electronic package 104 can be bonded to the printed circuit board 202 via the solder 204. The solder 204 can be for example, a set of solder bumps. In an embodiment, the solder 204 can provide a surface-mount packaging connection between the electronic package 104 and the printed circuit board 202. For example, the solder 204 can be a ball grid array to provide an electrical connection between the electronic package 104 and the printed circuit board 202. The printed circuit board 202 can mechanically support the electronic package 104 and/or one or more other electronic components. Furthermore, in certain embodiments, the printed circuit board 202 can electrically connect the electronic package 104 and/or one or more other electronic components. In certain embodiments, the printed circuit board 202 can be a specialized printed circuit board for deep learning, artificial intelligence, and/or high-performance computing.

Figure 3:
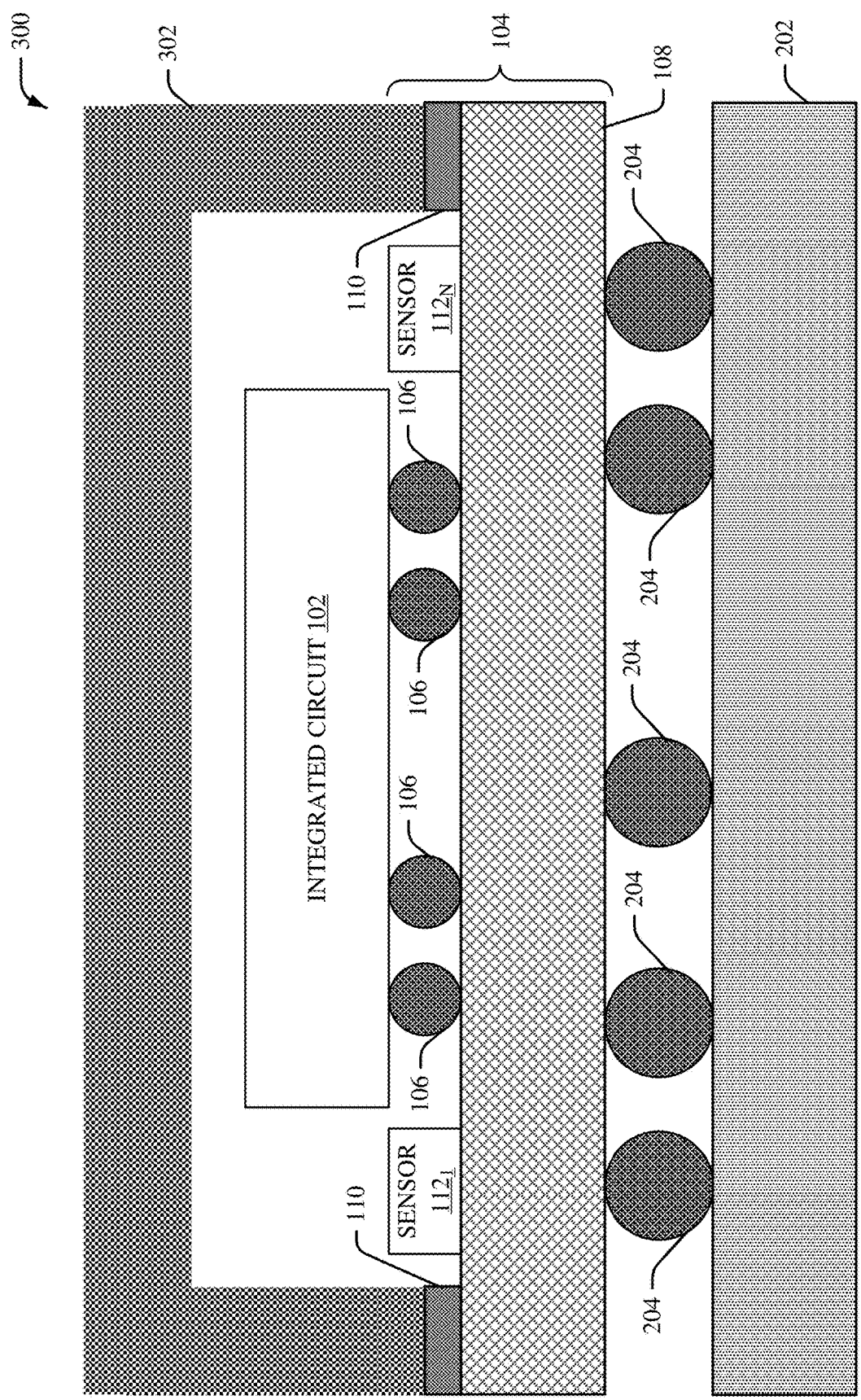
FIG. 3 illustrates an example, non-limiting system associated with an integrated circuit, an electronic package and a lid in accordance with one or more embodiments described herein.

FIG. 3 illustrates an example, non-limiting system 300 in accordance with one or more embodiments described herein. Repetitive description of like elements employed in other embodiments described herein is omitted for sake of brevity.

The system 300 includes the integrated circuit 102, the electronic package 104, the printed circuit board 202 and/or a lid 302. The electronic package 104 can include the chip carrier 108, the patterned structural material 110, and/or the one or more sensors $112_{1-N}$. The integrated circuit 102 can be bonded to the electronic package 104 via the solder 106. Furthermore, the electronic package 104 can be bonded to the printed circuit board 202 via the solder 204. The lid 302 can be a lid that provides an enclosure for the integrated circuit 102. Additionally or alternatively, the lid 302 can provide an enclosure for the one or more sensors $112_{1-N}$. In an embodiment, the lid 302 can be bonded to the patterned structural material 110. Furthermore, the patterned structural material 110 can be implemented as at least a portion of one or more lid posts for the lid 302. As such, force of one or more lid posts of the lid 302 can be adjusted via the patterned structural material 110 to mitigate stress of the electrical package 104. For instance, supporting force associated with the electronic package 104 and/or the lid 302 can be dynamically changed via the patterned structural material 110.

Figure 4:
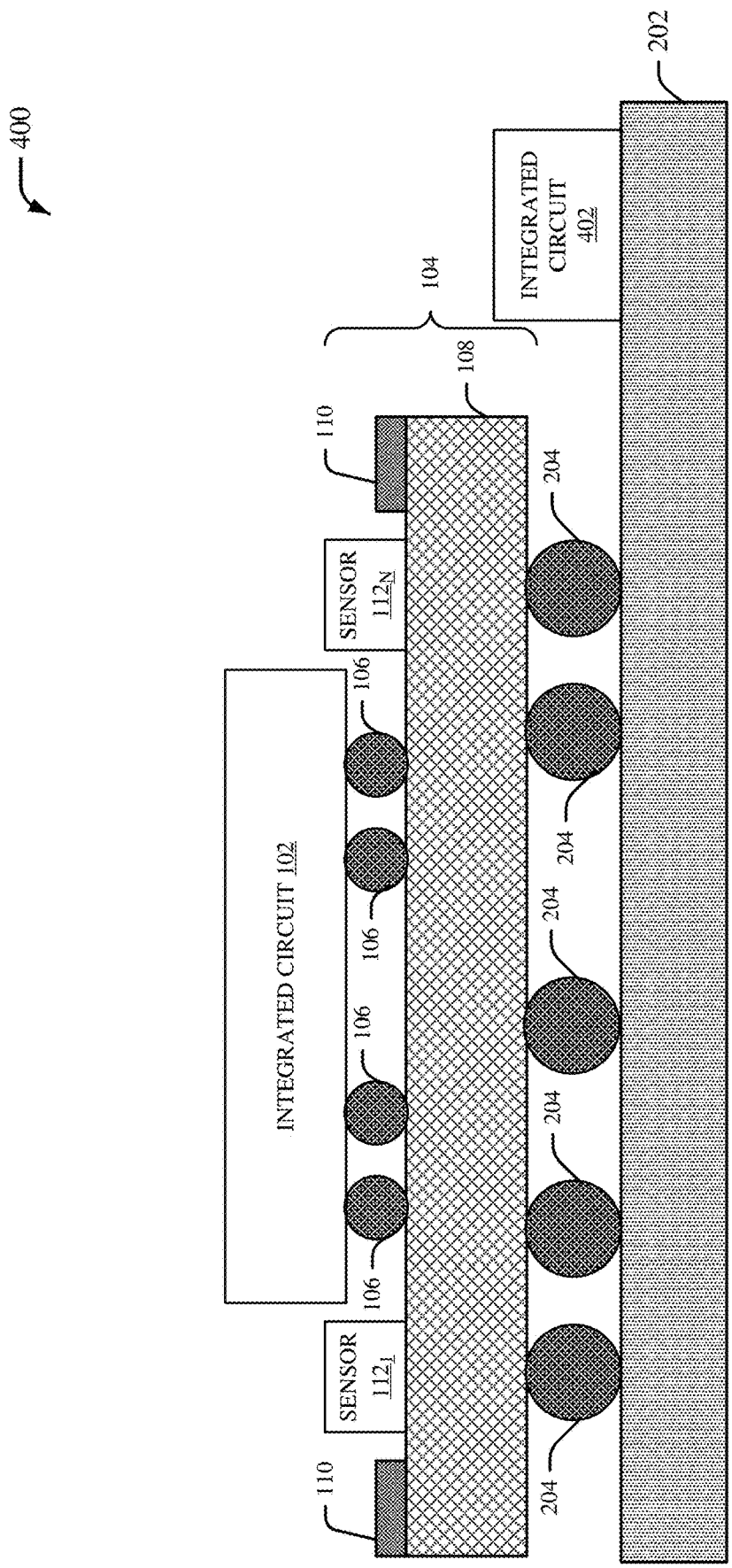
FIG. 4 illustrates another example, non-limiting system associated with an integrated circuit, an electronic package and a printed circuit board in accordance with one or more embodiments described herein.

FIG. 4 illustrates an example, non-limiting system 400 in accordance with one or more embodiments described herein. Repetitive description of like elements employed in other embodiments described herein is omitted for sake of brevity.

The system 400 includes the integrated circuit 102, the electronic package 104, the printed circuit board 202, and/or an integrated circuit 402. The electronic package 104 can include the chip carrier 108, the patterned structural material 110, and/or the one or more sensors $112_{1-N}$. The integrated circuit 102 can be bonded to the electronic package 104 via the solder 106. Furthermore, the electronic package 104 can be bonded to the printed circuit board 202 via the solder 204. The integrated circuit 402 can also be bonded to the printed circuit board 202. The integrated circuit 402 can be, for example, a controller device. The printed circuit board 202 can mechanically support the electronic package 104 and the integrated circuit 402. Furthermore, the printed circuit board 202 can electrically connect the electronic package 104 and the integrated circuit 402. For example, the integrated circuit 402 can be in communication with the one or more sensors $112_{1-N}$ via the printed circuit board 202. The sensor data generated by the one or more sensors $112_{1-N}$ N can be transmitted to the integrated circuit 402, for example, via one or more wired communication connections between the integrated circuit 402 and the one or more sensors $1121_{1-N}$ via the printed circuit board 202. Additionally or alternatively, the sensor data generated by the one or more sensors $112_{1-N}$ can be transmitted to the integrated circuit 402 via one or more wireless communication connections between the integrated circuit 402 and the one or more sensors $112_{1-N}$. Based on the sensor data provided by the one or more sensors $112_{1-N}$, the integrated circuit 402 can determine whether a control signal is to be generated to control an applied condition of the patterned structural material 110. For instance, the integrated circuit 402 can monitor the sensor data generated by the one or more sensors $112_{1-N}$. Furthermore, in response to a determination that the sensor data satisfies a defined criterion (e.g., the sensor data is above a defined threshold level), the integrated circuit 402 can generate a control signal to alter an applied condition of the patterned structural material 110, thereby controlling warpage of the chip carrier 108. Moreover, improved reliability of the electronic package 104 and/or the integrated circuit 102 can be provided.

Figure 5:
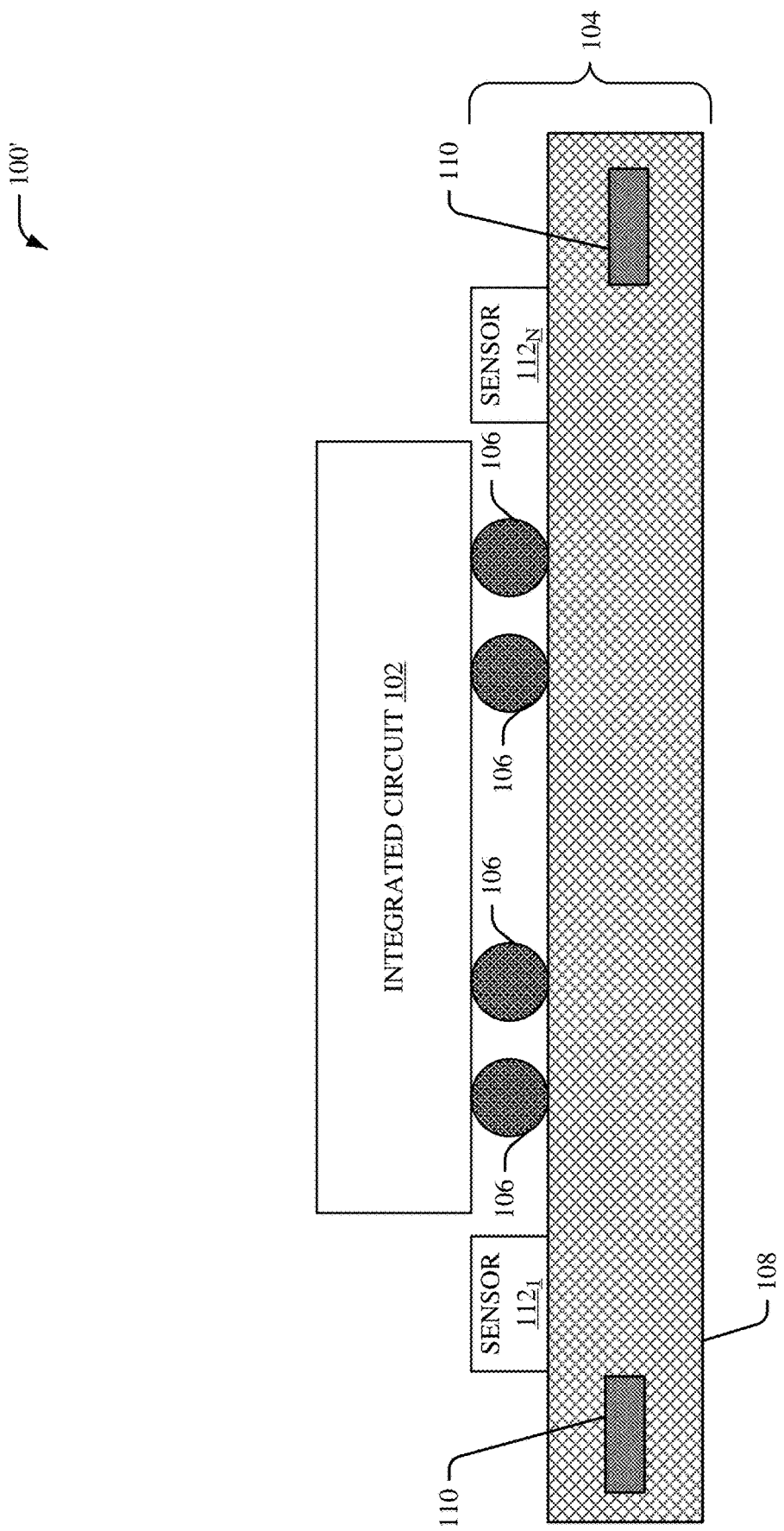
FIG. 5 illustrates another example, non-limiting system associated with an integrated circuit and an electronic package in accordance with one or more embodiments described herein.

FIG. 5 illustrates an example, non-limiting system 100' in accordance with one or more embodiments described herein. Repetitive description of like elements employed in other embodiments described herein is omitted for sake of brevity.

The system 100' can be an alternate embodiment of the system 100. the system 100' includes the integrated circuit 102 and the electronic package 104. The electronic package 104 can include the chip carrier 108, the patterned structural material 110, and/or the one or more sensors $112_{1-N}$. The integrated circuit 102 can be bonded to the electronic package 104 via the solder 106. In certain embodiments, the system 100' can additionally or alternatively include the printed circuit board 202, the solder 204, the lid 302, and/or the integrated circuit 402. In the embodiment shown in FIG. 5, the patterned structural material 110 can be deposited within the chip carrier 108. The patterned structural material 110 deposited within the chip carrier 108 can be associated with a mechanical characteristic that changes in response to an applied condition. For example, the patterned structural material 110 deposited within the chip carrier 108 can be associated with a mechanical characteristic that changes in response to an applied electrical condition. In another example, the patterned structural material 110 deposited within the chip carrier 108 can be associated with a mechanical characteristic that changes in response to an applied pneumatic condition. In yet another example, the patterned structural material 110 deposited within the chip carrier 108 can be associated with a mechanical characteristic that changes in response to an applied hydraulic condition. In an embodiment, the patterned structural material 110 deposited within the chip carrier 108 can be a piezoelectric material where a structure of the piezoelectric material (e.g., a shape of the piezoelectric material) is modified in response to an applied voltage. The patterned structural material 110 deposited within the chip carrier 108 can include, for example, a piezoelectric crystal, a piezoceramic material, a piezoelectric quartz and/or another type of piezoelectric material. For example, the patterned structural material 110 deposited within the chip carrier 108 can include, but is not limited to, quartz crystal, PZT, barium titanate, lithium niobite, etc. In another embodiment, the patterned structural material 110 deposited within the chip carrier 108 can be a memory alloy where a structure of the memory alloy is modified in response to an applied electric current. For example, a physical transformation of the memory alloy (e.g., expansion or contraction of the memory alloy) can be achieved by heating the memory alloy via an applied electric current. In yet another embodiment, the patterned structural material 110 deposited within the chip carrier 108 can be an electric actuator where a structure of the electric actuator is modified in response to an applied electric current, an applied fluid pressure, or an applied pneumatic pressure. The patterned structural material 110 deposited within the chip carrier 108 can be located at one or more locations within the chip carrier 108 to facilitate warpage control of the chip carrier 108. In certain embodiments, the one or more sensors $112_{1-N}$ can additionally or alternatively be deposited within the chip carrier 108.

Figure 6:
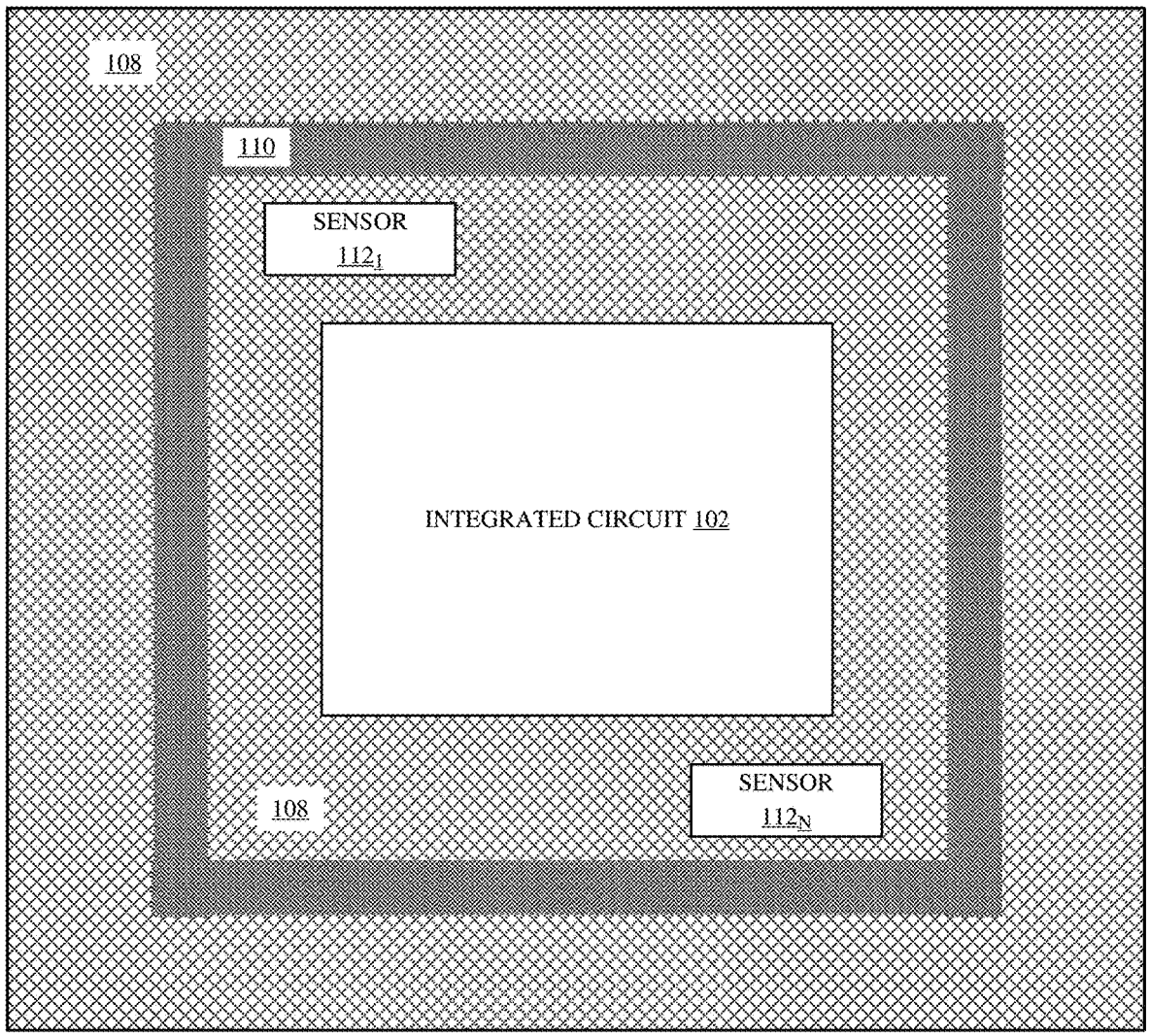
FIG. 6 illustrates an example, non-limiting system that facilitates active control of electronic package warpage in accordance with one or more embodiments described herein.

FIG. 6 illustrates an example, non-limiting system 600 in accordance with one or more embodiments described herein. Repetitive description of like elements employed in other embodiments described herein is omitted for sake of brevity.

The system 600 includes the integrated circuit 102, the chip carrier 108, the patterned structural material 110, and the one or more sensors $112_{1-N}$. Furthermore, the system 600 illustrates, for example, a top view of a device that includes the integrated circuit 102, the chip carrier 108, the patterned structural material 110, and the one or more sensors $112_{1-N}$. In an aspect, the integrated circuit 102, the patterned structural material 110, and the one or more sensors $112_{1-N}$ can be deposited on the chip carrier 108. The patterned structural material 110 can be, for example, a patterned stiffener material that surrounds the integrated circuit 102 and/or the one or more sensors $112_{1-N}$. For example, the patterned structural material 110 can be a continuous patterned stiffener material that surrounds the integrated circuit 102 and/or the one or more sensors $112_{1-N}$. In an embodiment, the sensor $112_1$ can be located at a first location on the chip carrier 108 and the sensor $112_N$ can be located at a second location on the chip carrier 108. However, it is to be appreciated that, in certain embodiments, the patterned structural material 110 can be configured in a different manner on the chip carrier 108. Furthermore, it is to be appreciated that, in certain embodiments, that the one or more sensors $112_{1-N}$ can be located in a different location on the chip carrier 108.

Figure 7:
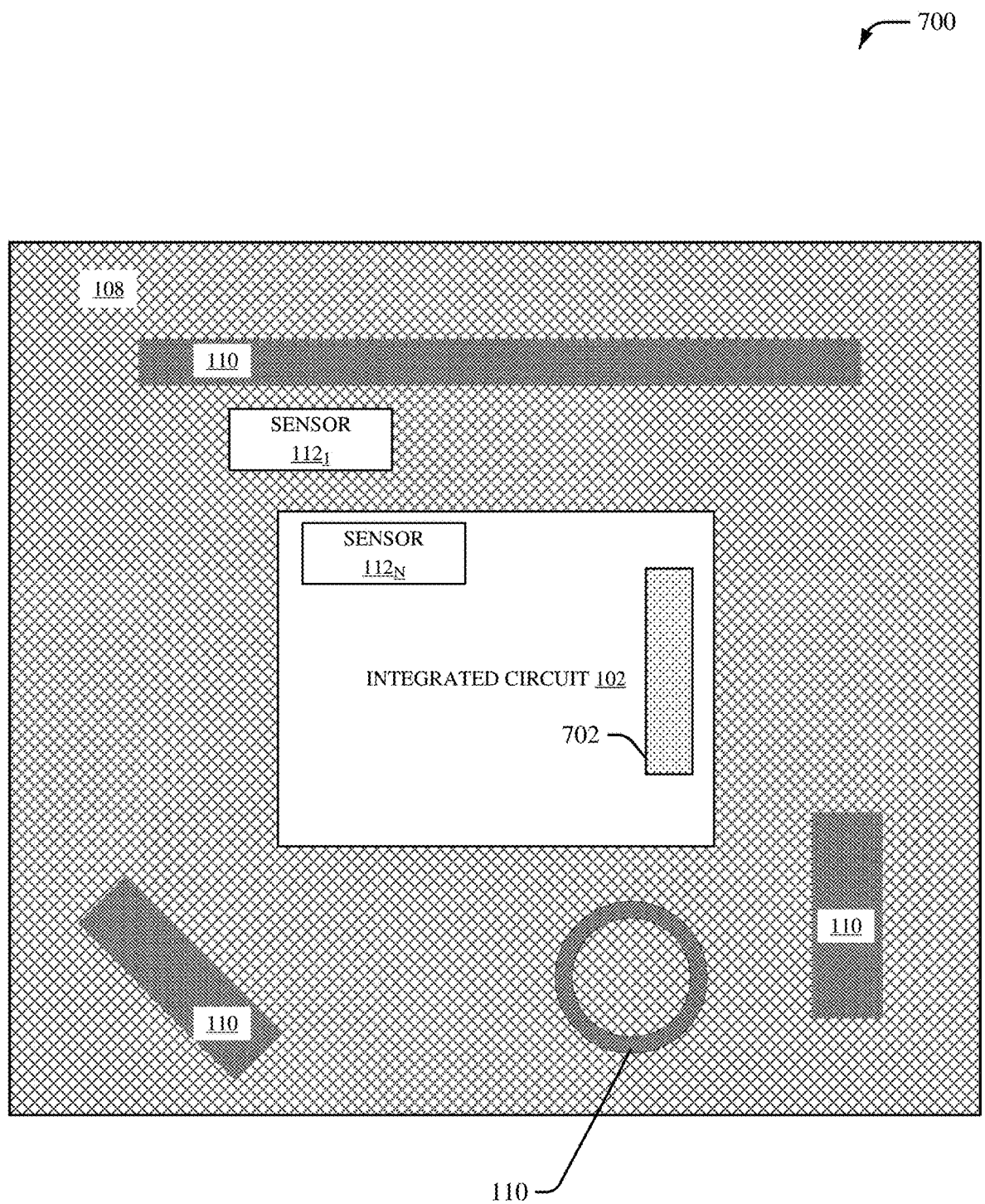
FIG. 7 illustrates another example, non-limiting system that facilitates active control of electronic package warpage in accordance with one or more embodiments described herein.

FIG. 7 illustrates an example, non-limiting system 700 in accordance with one or more embodiments described herein. Repetitive description of like elements employed in other embodiments described herein is omitted for sake of brevity.

The system 700 includes the integrated circuit 102, the chip carrier 108, the patterned structural material 110, and the one or more sensors $112_{1-N}$. Furthermore, the system 700 illustrates, for example, a top view of a device that includes the integrated circuit 102, the chip carrier 108, the patterned structural material 110, and the one or more sensors $112_{1-N}$. In an aspect, the integrated circuit 102, the patterned structural material 110, and the one or more sensors $112_{1-N}$ can be deposited on the chip carrier 108. Additionally or alternatively, the one or more sensors $112_{1-N}$ can be deposited on the integrated circuit 102. For example, the sensor $112_1$ can be deposited on the chip carrier 108 and the sensor $112_N$ can be deposited on a surface of the integrated circuit 102. In an embodiment, the patterned structural material 110 can be located at one or more locations on the chip carrier 108. For example, the patterned structural material 110 can be located approximately near a corner of the chip carrier 108, approximately at a center of the chip carrier 108, approximately at an edge of the chip carrier 108, on a top surface of the chip carrier 108, on a bottom surface of the chip carrier 108, and/or at a different location associated with the chip carrier 108. The patterned structural material 110 can also configured as one or more shapes. For example, the patterned structural material 110 can be configured as a line shape, a rectangular shape, a square shape, a circular shape, and/or another type of shape. In certain embodiments, patterned structural material 702 can be deposited on a surface of the integrated circuit 102. For example, the patterned structural material 702 can be deposited on a top surface of the integrated circuit 102 (e.g., a surface associated with the sensor $112_N$). In another example, the patterned structural material 702 can be deposited under the integrated circuit 102. The patterned structural material 702 can be associated with a mechanical characteristic that changes in response to an applied condition. For example, the patterned structural material 702 can be associated with a mechanical characteristic that changes in response to an applied electrical condition. In another example, the patterned structural material 702 can be associated with a mechanical characteristic that changes in response to an applied pneumatic condition. In yet another example, the patterned structural material 702 can be associated with a mechanical characteristic that changes in response to an applied hydraulic condition.

In an embodiment, the patterned structural material 702 can be a piezoelectric material where a structure of the piezoelectric material (e.g., a shape of the piezoelectric material) is modified in response to an applied voltage. The patterned structural material 702 can include, for example, a piezoelectric crystal, a piezoceramic material, a piezoelectric quartz and/or another type of piezoelectric material. For example, the patterned structural material 702 can include, but is not limited to, quartz crystal, PZT, barium titanate, lithium niobite, etc. In another embodiment, the patterned structural material 702 can be a memory alloy where a structure of the memory alloy is modified in response to an applied electric current. For example, a physical transformation of the memory alloy (e.g., expansion or contraction of the memory alloy) can be achieved by heating the memory alloy via an applied electric current. In yet another embodiment, the patterned structural material 702 can be an electric actuator where a structure of the electric actuator is modified in response to an applied electric current, an applied fluid pressure, or an applied pneumatic pressure. The patterned structural material 702 can be located at one or more locations on the integrated circuit 102 to facilitate warpage control of the chip carrier 108. The mechanical characteristic of the patterned structural material 702 can be controlled by the integrated circuit 102 and/or the integrated circuit 402. However, it is to be appreciated that, in certain embodiments, the patterned structural material 110 can be configured in a different manner on the chip carrier 108. Furthermore, it is to be appreciated that, in certain embodiments, that the one or more sensors $112_{1-N}$ can be located in a different location on the chip carrier 108.

Figure 8:
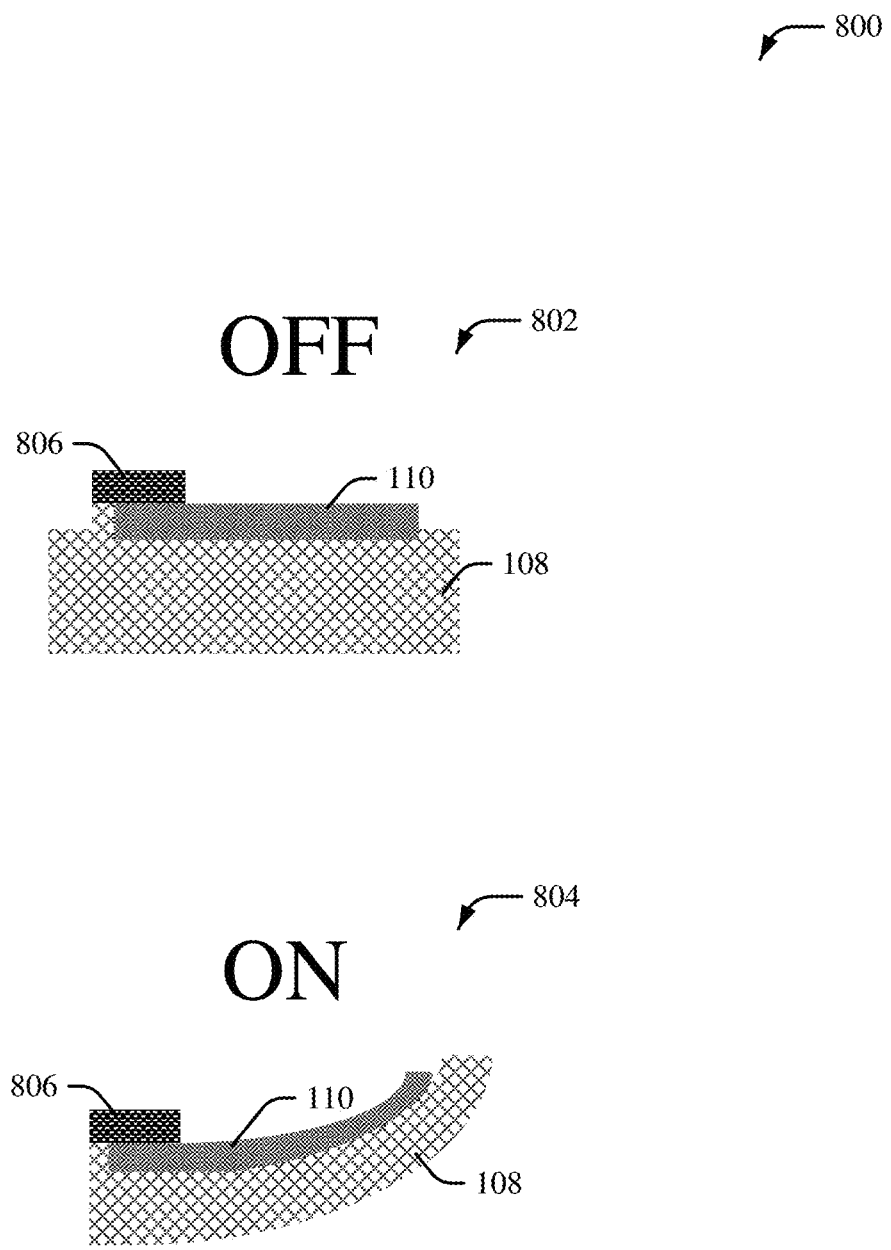
FIG. 8 illustrates yet another example, non-limiting system that facilitates active control of electronic package warpage in accordance with one or more embodiments described herein.

FIG. 8 illustrates an example, non-limiting system 800 in accordance with one or more embodiments described herein. Repetitive description of like elements employed in other embodiments described herein is omitted for sake of brevity.

The system 800 includes a warpage control phase 802 and a warpage control phase 804. In an embodiment, the patterned structural material 110 can be deposited on the chip carrier 108. Furthermore, an electrode 806 associated with a sensor (e.g., a sensor from the one or more sensors $112_{1-N}$) can be formed on the patterned structural material 110 and/or the chip carrier 108. The warpage control phase 802 can be a first phase (e.g., an "OFF" phase) where the patterned structural material 110 is not modified. For example, a sensor associated with the electrode 806 (e.g., a sensor from the one or more sensors $112_{1-N}$) can generate sensor data so that a status of the patterned structural material 110 deposited on the chip carrier 108 can be monitored (e.g., by the integrated circuit 102 or the integrated circuit 402). Furthermore, the patterned structural material 110 can be associated with the warpage control phase 802 in response to a determination, based on the sensor data generated by a sensor associated with the electrode 806 (e.g., a sensor from the one or more sensors $112_{1-N}$), that modification of a condition for the patterned structural material 110 is not needed. The warpage control phase 804 can be a second phase (e.g., an "OFF" phase) where the patterned structural material 110 is modified. For example, the patterned structural material 110 can be associated with the warpage control phase 804 in response to a determination, based on the sensor data generated by a sensor associated with the electrode 806 (e.g., a sensor from the one or more sensors $112_{1-N}$), that modification of a condition for the patterned structural material 110 is needed. Alteration of the patterned structural material 110 can thereby alter a mechanical characteristic (e.g., a shape) of the chip carrier 108. In one example, a sensor associated with the electrode 806 (e.g., a sensor from the one or more sensors $112_{1-N}$) can measure a certain amount of strain associated with the chip carrier 108 to initiate the warpage control phase 804.

Figure 9:
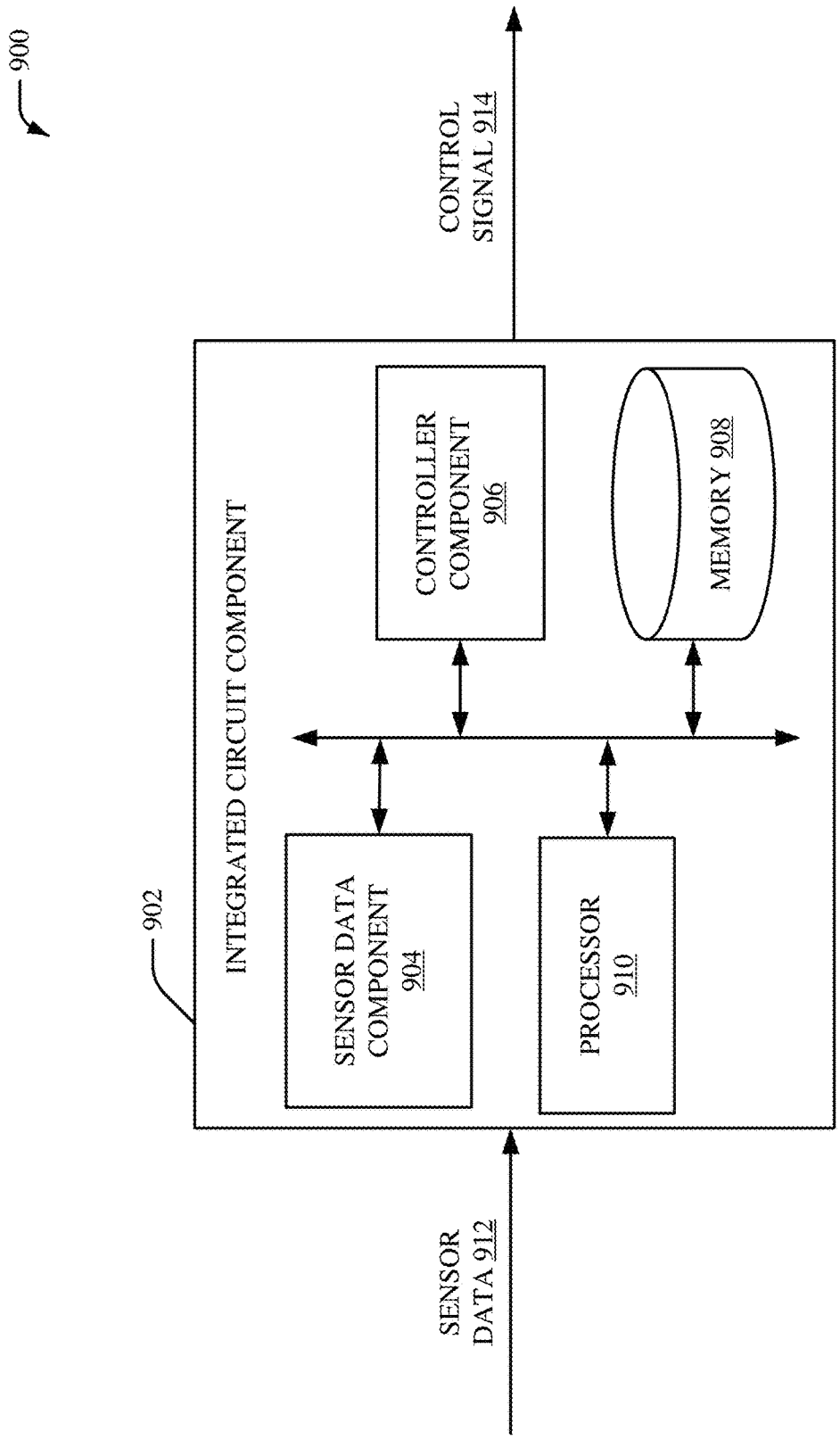
FIG. 9 illustrates a block diagram of an example, non-limiting system that includes an integrated circuit component in accordance with one or more embodiments described herein.

FIG. 9 illustrates a block diagram of an example, non-limiting system 800 in accordance with one or more embodiments described herein. Repetitive description of like elements employed in other embodiments described herein is omitted for sake of brevity.

In various embodiments, the system 900 can be a system associated with technologies such as, but not limited to, electronic chip technologies, integrated circuit technologies, electronic package technologies, flip chip technologies, artificial intelligence technologies, high-performance computing technologies, circuit technologies, computer technologies, or other technologies. The system 900 can employ hardware or software to solve problems that are highly technical in nature, that are not abstract and that cannot be performed as a set of mental acts by a human. Further, in certain embodiments, some of the processes performed may be performed by one or more specialized computers (e.g., one or more specialized processing units, one or more controllers, a specialized computer with an integrated circuit component, etc.) for carrying out defined tasks related to active control of electronic package warping. The system 900 or components of the system 900 can be employed to solve new problems that arise through advancements in technologies mentioned above, computer architecture, or the like. One or more embodiments of the system 900 can provide technical improvements to electronic chip systems, integrated circuit systems, electronic package systems, flip chip systems, artificial intelligence systems, high-performance computing systems, circuit systems, computer systems, or other systems. One or more embodiments of the system 900 can also provide technical improvements to an integrated circuit (e.g., an electronic chip) associated with an electronic package by at least improving quality of an integrated circuit (e.g., an electronic chip) associated with an electronic package, improving performance of an integrated circuit (e.g., an electronic chip) associated with an electronic package, improving voltage characteristics of an integrated circuit (e.g., an electronic chip) associated with an electronic package, and/or one or more other technical improvements associated with an integrated circuit (e.g., an electronic chip) associated with an electronic package.

In the embodiment shown in FIG. 9, the system 900 can include an integrated circuit component 902. As shown in FIG. 9, the integrated circuit component 902 can include a sensor data component 904 and a controller component 906. Aspects of the integrated circuit component 902 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the integrated circuit component 902 can also include memory 908 that stores computer executable components and instructions. Furthermore, the integrated circuit component 902 can include a processor 910 to facilitate execution of the instructions (e.g., computer executable components and corresponding instructions) by the integrated circuit component 902. As shown, the sensor data component 904, the controller component 906, the memory 908 and/or the processor 910 can be electrically or communicatively coupled to one another in one or more embodiments. In an embodiment, the integrated circuit component 902 can be included in the integrated circuit 102. In another embodiment, the integrated circuit component 902 can be included in the integrated circuit 402.

The integrated circuit component 902 (e.g., the sensor data component 904 of the integrated circuit component 902) can receive sensor data 912. For example, the one or more sensors 112$_{1-N}$ can generate the sensor data 912. Additionally or alternatively, the one or more sensors 112$_{1-N}$ can provide the sensor data 912 to the integrated circuit component 902 (e.g., the sensor data component 904 of the integrated circuit component 902). In an embodiment, the integrated circuit component 902 can monitor the one or more sensors 112$_{1-N}$ to obtain the sensor data 912. The sensor data 912 can include a status of the electronic package 104. For example, the sensor data 912 can include a status of the chip carrier 108. Furthermore, the sensor data 912 can include strain sensor data, thermal sensor data, humidity sensor data and/or other sensor data. For instance, the sensor data 912 can include data related to a strain status, a stress status, a temperature status, a humidity status and/or another status of the electronic package 104 and/or the integrated circuit 102.

The controller component 906 can control an applied condition of the patterned structural material 110 and/or the patterned structural material 702. For example, the controller component 906 can control an applied electrical condition of the patterned structural material 110 and/or the patterned structural material 702. In another example, the controller component 906 can additionally or alternatively control an applied pneumatic condition of the patterned structural material 110 and/or the patterned structural material 702. In yet another example, the controller component 906 can additionally or alternatively control an applied hydraulic condition of the patterned structural material 110 and/or the patterned structural material 702. In yet another example, the controller component 906 can additionally or alternatively control an applied humidity condition of the patterned structural material 110 and/or the patterned structural material 702. In an embodiment, the controller component 906 can alter the applied condition of the patterned structural material 110 and/or the patterned structural material 702 in response to a determination that the sensor data 912 satisfies a defined criterion. For instance, the controller component 906 can alter the applied electrical condition, the applied pneumatic condition, and/or the applied hydraulic condition of the patterned structural material 110 and/or the patterned structural material 702 in response to a determination that the sensor data 912 satisfies a defined criterion. In an example, the controller component 906 can alter the applied condition of the patterned structural material 110 and/or the patterned structural material 702 in response to a determination that at least a portion of the sensor data 912 is above a defined threshold level. In an aspect, the controller component 906 can generate a control signal 914 to alter to the applied condition of the patterned structural material 110 and/or the patterned structural material 702 in response to the determination that the sensor data 912 satisfies the defined criterion. For example, the controller component 906 can generate a control signal 914 to alter to the applied electrical condition, the applied pneumatic condition, and/or the applied hydraulic condition of the patterned structural material 110 and/or the patterned structural material 702 in response to the determination that the sensor data 912 satisfies the defined criterion. In certain embodiments, the control signal 914 can transition the warpage control phase 802 to the warpage control phase 804. In certain embodiments, the control signal 914 can transition the warpage control phase 804 to the warpage control phase 802. In another embodiment, the controller component 906 can withhold from altering the applied condition of the patterned structural material 110 and/or the patterned structural material 702 in response to a determination that the sensor data 912 does not satisfy the defined criterion. For instance, the controller component 906 can withhold from altering the applied electrical condition, the applied pneumatic condition, and/or the applied hydraulic condition of the patterned structural material 110 and/or the patterned structural material 702 in response to a determination that the sensor data 912 does not satisfy the defined criterion. In an example, the controller component 906 can withhold from altering the applied condition of the patterned structural material 110 and/or the patterned structural material 702 in response to a determination that at least a portion of the sensor data 912 is below the defined threshold level. As such, reliability of the electronic package 104 and/or the integrated circuit 102 can be improved. Furthermore, warpage associated with the chip carrier 108 can be reduced.

Figure 10:
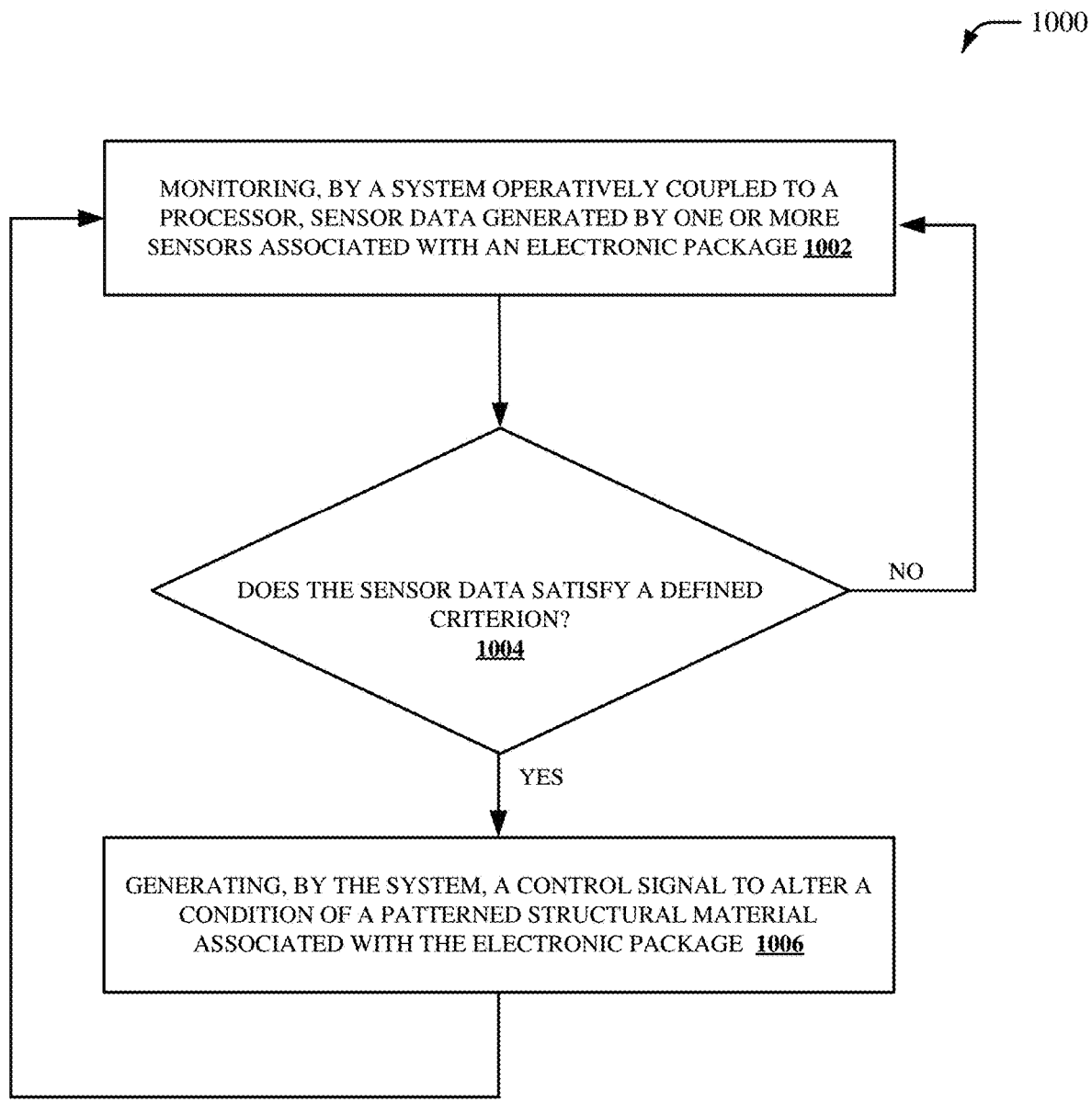
FIG. 10 illustrates a flow diagram of an example, non-limiting method that facilitates active control of electronic package warpage in accordance with one or more embodiments described herein.

FIG. 10 illustrates a flow diagram of an example, non-limiting computer-implemented method 1000 for facilitating active control of electronic package warpage in accordance with one or more embodiments described herein. Repetitive description of like elements employed in other embodiments described herein is omitted for sake of brevity. At 1002, sensor data generated by one or more sensors associated with an electronic package is monitored, by a system operatively coupled to a processor (e.g., by sensor data component 904). The one or more sensors can be one or more strain sensors (e.g., one or more strain gauges). In certain embodiments, the one or more sensors can additionally or alternatively be one or more thermal sensors, one or more humidity sensors, and/or one or more other sensors. The sensor data can include a status of the electronic package. Additionally or alternatively, the sensor data can include a status of an integrated circuit associated with the electronic package. In one example, the sensor data can include a status of a chip carrier associated with the electronic package. Furthermore, the sensor data can include strain sensor data, thermal sensor data, humidity sensor data and/or other sensor data generated by the one or more strain sensors, one or more thermal sensors, one or more humidity sensors, and/or one or more other sensors. For instance, the sensor data can include data related to a strain status, a stress status, a temperature status, a humidity status and/or another status of an electronic package and/or an integrated circuit. In certain embodiments, the one or more sensors can be calibrated (e.g., prior to monitoring the sensor data). For example, the one or more sensors can undergo one or more calibration processes (e.g., prior to monitoring the sensor data).

At 1004, it is determined whether the sensor data satisfies a defined criterion. For example, it can be determined whether the sensor data is above a defined threshold level. If no, the computer-implemented method 1000 returns to 1002. If yes, the computer-implemented method 1000 proceeds to 1006.

At 1006, a control signal is generated, by the system (e.g., by controller component 906), to alter a condition of a patterned structural material associated with the electronic package in response to a determination that the sensor data satisfies a defined criterion. The patterned structural material can be associated with a mechanical characteristic that changes in response to the condition. The condition can be an applied condition such as an applied electrical condition, an applied pneumatic condition and/or an applied hydraulic condition. For example, the patterned structural material can be associated with a mechanical characteristic that changes in response to an applied electrical condition. In another example, the patterned structural material can be associated with a mechanical characteristic that changes in response to an applied pneumatic condition. In yet another example, the patterned structural material can be associated with a mechanical characteristic that changes in response to an applied hydraulic condition. In an embodiment, the patterned structural material can be a piezoelectric material where a structure of the piezoelectric material (e.g., a shape of the piezoelectric material) is modified in response to an applied voltage. The patterned structural material can include, for example, a piezoelectric crystal, a piezoceramic material, a piezoelectric quartz and/or another type of piezoelectric material. For example, the patterned structural material can include, but is not limited to, quartz crystal, PZT, barium titanate, lithium niobite, etc. In another embodiment, the patterned structural material can be a memory alloy where a structure of the memory alloy is modified in response to an applied electric current. For example, a physical transformation of the memory alloy (e.g., expansion or contraction of the memory alloy) can be achieved by heating the memory alloy via an applied electric current. In yet another embodiment, the patterned structural material can be an electric actuator where a structure of the electric actuator is modified in response to an applied electric current, an applied fluid pressure, or an applied pneumatic pressure. The patterned structural material can be located at one or more locations on the electronic package to facilitate warpage control of the electronic package. In certain embodiments, generating the control signal can include improving reliability of an integrated circuit associated with the electronic package. In certain embodiments, an electric actuator associated with the patterned structural material can be calibrated (e.g., prior to monitoring the sensor data).

For simplicity of explanation, the computer-implemented methodologies are depicted and described as a series of acts. It is to be understood and appreciated that the subject innovation is not limited by the acts illustrated or by the order of acts, for example acts can occur in various orders or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because at least monitoring sensor data, generating a control signal, etc. are established from a combination of electrical and mechanical components and circuitry, a human is unable to replicate or perform active control of electronic package warpage associated with the integrated circuit component 902 (e.g., the sensor data component 904 and/or the controller component 906) disclosed herein. For example, a human is unable to monitor sensor data, generate a control signal, etc.

Figure 11:
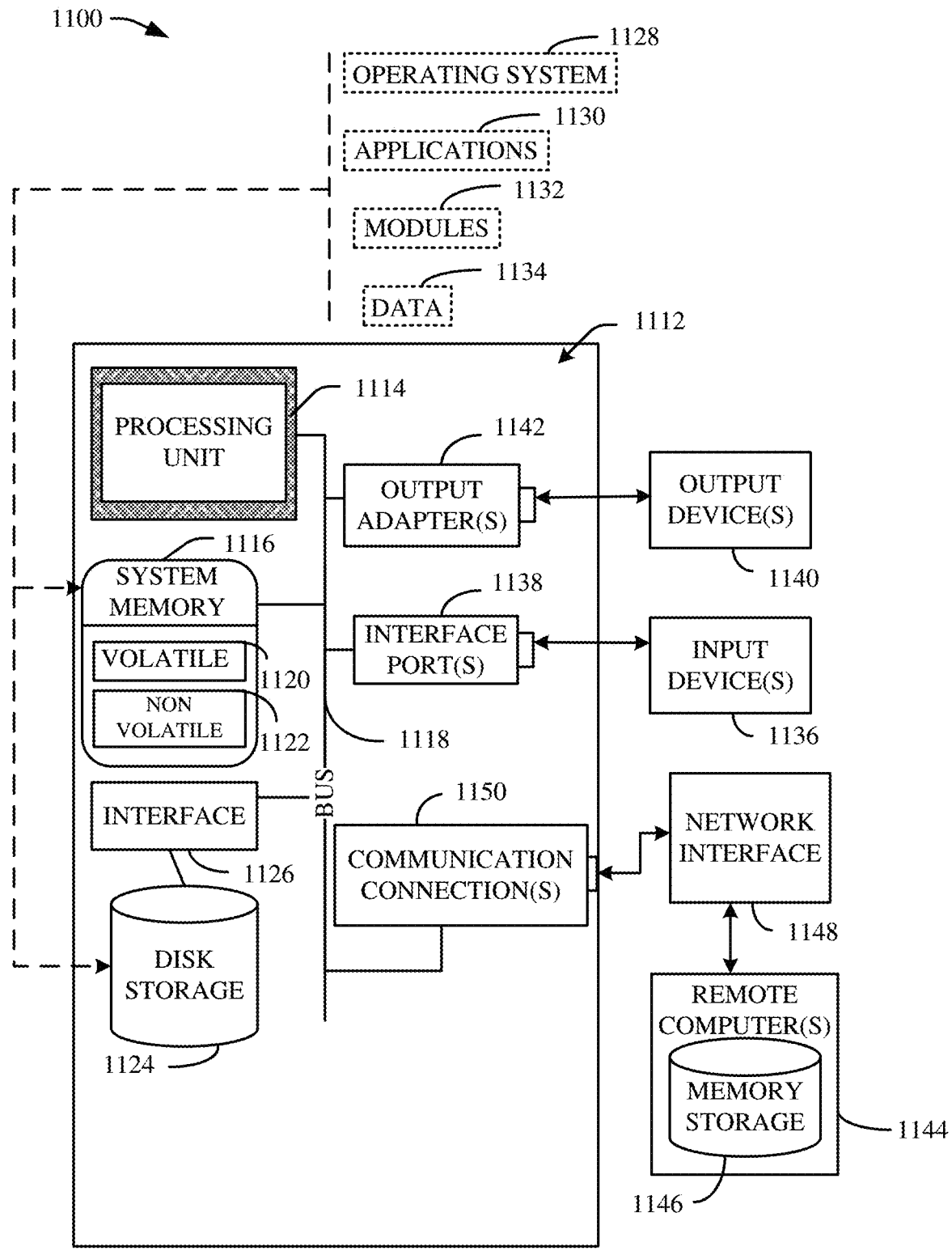
FIG. 11 illustrates a block diagram of an example, non-limiting operating environment in which one or more embodiments described herein can be facilitated.

In order to provide a context for the various aspects of the disclosed subject matter, FIG. 11 as well as the following discussion are intended to provide a general description of a suitable environment in which the various aspects of the disclosed subject matter can be implemented. FIG. 11 illustrates a block diagram of an example, non-limiting operating environment in which one or more embodiments described herein can be facilitated. Repetitive description of like elements employed in other embodiments described herein is omitted for sake of brevity.

With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media. To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor-based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present invention may be a system, a method, an apparatus or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network or a wireless network. The network can comprise copper transmission cables, optical transmission fibers, wireless transmission, routers, firewalls, switches, gateway computers or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations or block diagrams of methods, apparatus (systems), and computer program products according to embodiments of the invention. It will be understood that each block of the flowchart illustrations or block diagrams, and combinations of blocks in the flowchart illustrations or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart or block diagram block or blocks. These computer readable program instructions can also be stored in a computer readable storage medium that can direct a computer, a programmable data processing apparatus, or other devices to function in a particular manner, such that the computer readable storage medium having instructions stored therein comprises an article of manufacture including instructions which implement aspects of the function/act specified in the flowchart or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer or computers, those skilled in the art will recognize that this disclosure also can or can be implemented in combination with other program modules. Generally, program modules include routines, programs, components, data structures, etc. that perform particular tasks or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, or a computer. By way of illustration, both an application running on a server and the server can be a component. One or more components can reside within a process or thread of execution and a component can be localized on one computer or distributed between two or more computers. In another example, respective components can execute from various computer readable media having various data structures stored thereon. The components can communicate via local or remote processes such as in accordance with a signal having one or more data packets (e.g., data from one component interacting with another component in a local system, distributed system, or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" or "exemplary" are utilized to mean serving as an example, instance, or illustration. For the avoidance of doubt, the subject matter disclosed herein is not limited by such examples. In addition, any aspect or design described herein as an "example" or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   an electronic package that comprises a patterned structural material associated with a mechanical characteristic that changes in response to an applied condition; and
   an integrated circuit that controls the applied condition associated with the patterned structural material based on sensor data associated with a status of the electronic package.

2. The system of claim 1, wherein the integrated circuit is bonded to a chip carrier material.

3. The system of claim 2, wherein the electronic package comprises a sensor that generates the sensor data.

4. The system of claim 3, wherein the sensor is a strain sensor.

5. The system of claim 3, wherein the sensor is fabricated on the chip carrier material.

6. The system of claim 1, wherein the electronic package and the integrated circuit are bonded to a printed circuit board.

7. The system of claim 1, wherein the patterned structural material is a piezoelectric material.

8. The system of claim 1, wherein the patterned structural material is a memory alloy.

9. The system of claim 1, wherein the patterned structural material is an electric actuator.

10. The system of claim 1, wherein the integrated circuit controls the applied condition associated with the patterned structural material to provide improved reliability for the electronic package.

11. A computer-implemented method, comprising:
    monitoring, by a system operatively coupled to a processor, sensor data generated by one or more sensors associated with an electronic package; and
    generating, by the system, a control signal to alter a condition of a patterned structural material associated with the electronic package in response to a determination that the sensor data satisfies a defined criterion.

12. The computer-implemented method of claim 11, wherein the monitoring the sensor data comprises receiving the sensor data from a strain sensor, a thermal sensor or a humidity sensor.

13. The computer-implemented method of claim 11, wherein the generating the control signal comprises altering an electrical condition of the patterned structural material associated with the electronic package in response to the determination that the sensor data satisfies the defined criterion.

14. The computer-implemented method of claim 11, wherein the generating the control signal comprises altering a pneumatic condition of the patterned structural material associated with the electronic package in response to the determination that the sensor data satisfies the defined criterion.

15. The computer-implemented method of claim 11, wherein the generating the control signal comprises improving reliability of an integrated circuit associated with the electronic package.

* * * * *